United States Patent
Murooka

(10) Patent No.: US 9,349,446 B2
(45) Date of Patent: May 24, 2016

(54) SEMICONDUCTOR MEMORY DEVICE AND METHOD OF CONTROLLING THE SAME

(71) Applicant: Kabushiki Kaisha Toshiba, Minato-ku (JP)

(72) Inventor: Kenichi Murooka, San Jose, CA (US)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/593,254

(22) Filed: Jan. 9, 2015

(65) Prior Publication Data

US 2016/0071583 A1    Mar. 10, 2016

Related U.S. Application Data

(60) Provisional application No. 62/045,595, filed on Sep. 4, 2014.

(51) Int. Cl.
*G11C 13/00*    (2006.01)
*G11C 5/06*    (2006.01)
*G11C 5/02*    (2006.01)

(52) U.S. Cl.
CPC ........ *G11C 13/0021* (2013.01); *G11C 13/0069* (2013.01); *G11C 13/0002* (2013.01); *G11C 13/003* (2013.01); *G11C 13/004* (2013.01); *G11C 13/0004* (2013.01); *G11C 13/0028* (2013.01); *G11C 2213/71* (2013.01)

(58) Field of Classification Search
CPC ............. G11C 13/0069; G11C 13/004; G11C 13/0002; G11C 13/0004; G11C 13/003; G11C 13/0028; G11C 2213/71

USPC .............................................. 365/51, 63, 148
See application file for complete search history.

(56) References Cited

U.S. PATENT DOCUMENTS

| 8,320,156 | B2 | 11/2012 | Murooka | |
|---|---|---|---|---|
| 8,891,277 | B2 | 11/2014 | Murooka | |
| 2009/0207642 | A1* | 8/2009 | Shimano et al. | ................. 365/72 |
| 2012/0147644 | A1 | 6/2012 | Scheuerlein | |

(Continued)

FOREIGN PATENT DOCUMENTS

| JP | 5197512 | 5/2013 |
|---|---|---|
| JP | 2013-120618 | 6/2013 |
| JP | 2013-153127 | 8/2013 |

OTHER PUBLICATIONS

U.S. Appl. No. 14/849,023, filed Sep. 9, 2015, Murooka.

(Continued)

*Primary Examiner* — Ly D Pham
(74) *Attorney, Agent, or Firm* — Oblon, McClelland, Maier & Neustadt, L.L.P

(57) ABSTRACT

A plurality of word lines extend in a first direction and are disposed in a second direction and a third direction. A plurality of bit lines extend in the third direction and are disposed in the first direction and the second direction. A global bit line is coupled in common to the plurality of bit lines. A selection elements is disposed between the bit line and the global bit line. A control circuit is able to perform respective operations of reading, writing, and deletion on the storage element. A resistive element is disposed on the global bit line side with respect to the selection element. The resistive element adjusts a magnitude of a voltage to be applied to the selection element according to a magnitude of a current flowing through the selection element.

7 Claims, 9 Drawing Sheets

(56) References Cited

U.S. PATENT DOCUMENTS

| | | |
|---|---|---|
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2013/0148400 A1 | 6/2013 | Murooka |
| 2013/0187118 A1 | 7/2013 | Murooka |
| 2014/0085961 A1* | 3/2014 | Kanamori et al. .............. 365/72 |
| 2014/0306174 A1 | 10/2014 | Murooka |
| 2014/0340956 A1 | 11/2014 | Murooka |

OTHER PUBLICATIONS

U.S. Appl. No. 14/017,727, filed Sep. 4, 2013, Kenichi Murooka.
U.S. Appl. No. 14/282,047, filed May 20, 2014, Kenichi Murooka.
U.S. Appl. No. 14/156,595, filed Jan. 16, 2014, Kenichi Murooka.
U.S. Appl. No. 14/284,516, filed May 22, 2014, Kenichi Murooka.
U.S. Appl. No. 14/593,344, filed Jan. 9, 2015, Murooka.

* cited by examiner

SEMICONDUCTOR MEMORY DEVICE AND METHOD OF CONTROLLING THE SAME

CROSS REFERENCE TO RELATED APPLICATION

This application is based on and claims the benefit of priority from prior U.S. Provisional Patent Application No. 62/045595, filed on Sep. 4, 2014, the entire contents of which are incorporated herein by reference.

BACKGROUND

1. Field

Embodiments described herein relate generally to a semiconductor memory device and a method of controlling the same.

2. Description of the Related Art

Conventionally, there has been proposed a semiconductor memory device that uses a variable resistive element, which changes a resistance value by applying a voltage, as a storage element. Conventionally, a three-dimensional memory cell array structure is also known. The memory cell array structure includes the above-described variable resistive element at an intersection portion of a first wiring and a second wiring. The first wiring is formed vertical to a substrate. The second wiring is formed horizontal to the substrate.

DETAILED DESCRIPTION

Figure 1:
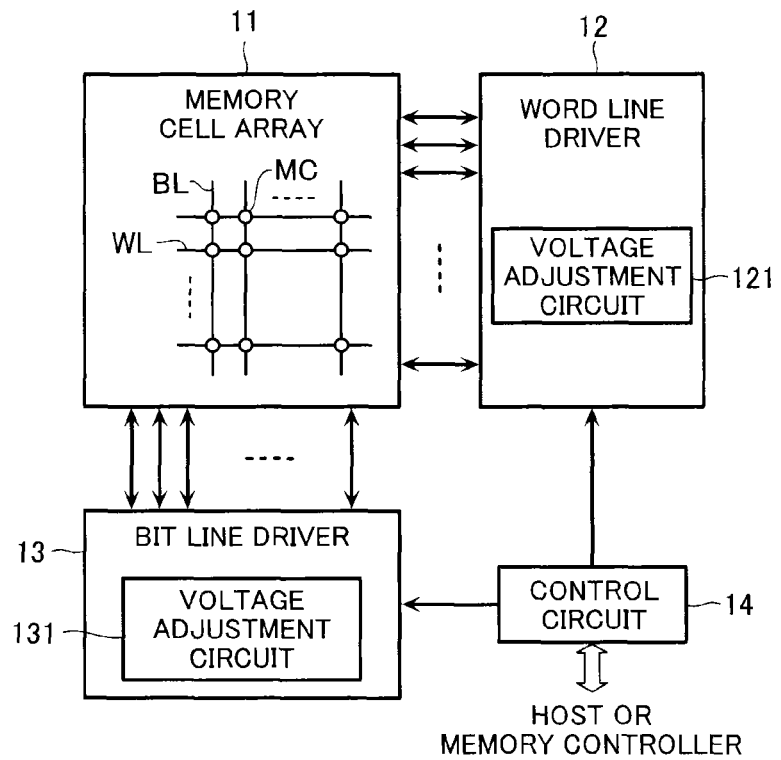
FIG. 1 is a block diagram illustrating a constitution of a semiconductor memory device according to a first embodiment.

A semiconductor memory device according to one embodiment includes a plurality of word lines, a plurality of bit lines, a variable resistance layer, a global bit line, a selection element, a control circuit, and a resistive element. The plurality of word lines extend in a first direction. The plurality of word lines are disposed in a second direction and a third direction by respective predetermined distances. The second direction intersects the first direction. The third direction intersects the first direction and the second direction. The plurality of bit lines extend in the third direction. The plurality of bit lines are disposed in the first direction and the second direction by respective predetermined distances. The variable resistance layer disposed between the word line and the bit line. The variable resistance layer functions as a storage element. The global bit line is coupled in common to the plurality of bit lines. The selection element is disposed between the bit line and the global bit line. The control circuit is able to perform respective operations of reading, writing, and deletion on the storage element. The resistive element is disposed on the global bit line side with respect to the selection element. The resistive element has a function to adjust a magnitude of a voltage to be applied to the selection element according to a magnitude of a current flowing through the selection element.

A semiconductor memory device according to another embodiment includes a plurality of word lines, a plurality of bit lines, a variable resistance layer, a global bit line, a selection element, a control circuit, and a resistive element. The plurality of word lines extend in a first direction. The plurality of word lines are disposed in a second direction and a third direction by respective predetermined distances. The second direction intersects the first direction. The third direction intersects the first direction and the second direction. The plurality of bit lines extend in the third direction. The plurality of bit lines are disposed in the first direction and the second direction by respective predetermined distances. The variable resistance layer is disposed between the word line and the bit line. The variable resistance layer functions as a storage element. The global bit line is coupled in common to the plurality of bit lines. The selection element is disposed between the bit line and the global bit line. The control circuit is able to perform respective operations of reading, writing, and deletion on the storage element. The resistive element is disposed on the word line side with respect to the selection element. The resistive element has a function to adjust a magnitude of a voltage to be applied to the selection element according to a magnitude of a current flowing through the selection element.

A control method of a semiconductor memory device according to one embodiment is a control method of the semiconductor memory device that includes a plurality of word lines, a plurality of bit lines, a variable resistance layer, a global bit line, a selection element, a control circuit, and a resistive element. The plurality of word lines extend in a first direction. The plurality of word lines are disposed in a second direction and a third direction by respective predetermined distances. The second direction intersects the first direction. The third direction intersects the first direction and the second direction. The plurality of bit lines extend in the third direction. The plurality of bit lines are disposed in the first direction and the second direction by respective predetermined distances. The variable resistance layer disposed between the word line and the bit line. The variable resistance layer functions as a storage element. The global bit line is coupled in common to the plurality of bit lines. The selection element is disposed between the bit line and the global bit line. The control circuit is able to perform respective operations of reading, writing, and deletion on the storage element. The resistive element is disposed on the global bit line side with respect to the selection element. The resistive element has a function to adjust a magnitude of a voltage to be applied to the selection element according to a magnitude of a current flowing through the selection element. The control method includes adjusting a resistance value of the variable resistive element according to a length of the global bit line between the selection element corresponding to the selected storage element and the global bit line driving circuit.

The semiconductor memory device according to the embodiments will be described in detail hereinafter with reference to the accompanying drawings.

First Embodiment

FIG. 1 is a block diagram illustrating a constitution of a semiconductor memory device according to a first embodiment. This semiconductor memory device includes a memory cell array 11, a word line driver 12, a bit line driver 13, and a control circuit 14. The memory cell array 11 includes a bit line BL and a word line WL. The bit line BL and the word line WL extend in a direction intersecting with one another. At an intersection portion of these bit line BL and word line WL, a memory cell MC is disposed. As described later, the memory cell MC includes a variable resistive element that can store data in accordance with high/low of a resistance value.

The word line driver 12 includes a voltage adjustment circuit 121. The word line driver 12 is coupled to the word lines WL and the control circuit 14. The voltage adjustment circuit 121 generates various voltages including a selected word line voltage and a non-selected word line voltage. The word line driver 12 supplies the word lines WL with the various voltages based on address information provided from the control circuit 14.

The bit line driver 13 includes a voltage adjustment circuit 131. The bit line driver 13 is coupled to the bit line BL and the control circuit 14. The voltage adjustment circuit 131 generates various voltages including a selected bit line voltage and a non-selected bit line voltage. The bit line driver 13 supplies the bit line BL with the various voltages based on an address provided from the control circuit 14.

The control circuit 14 controls the word line driver 12 and the bit line driver 13 in accordance with a command input from an external host or a memory controller. By the above-described operations, a predetermined voltage is applied to a selected word line WL and a selected bit line BL. Thus, a setting operation or a resetting operation is performed on a memory cell MC. These operations will be described in FIG. 3.

Figure 2:
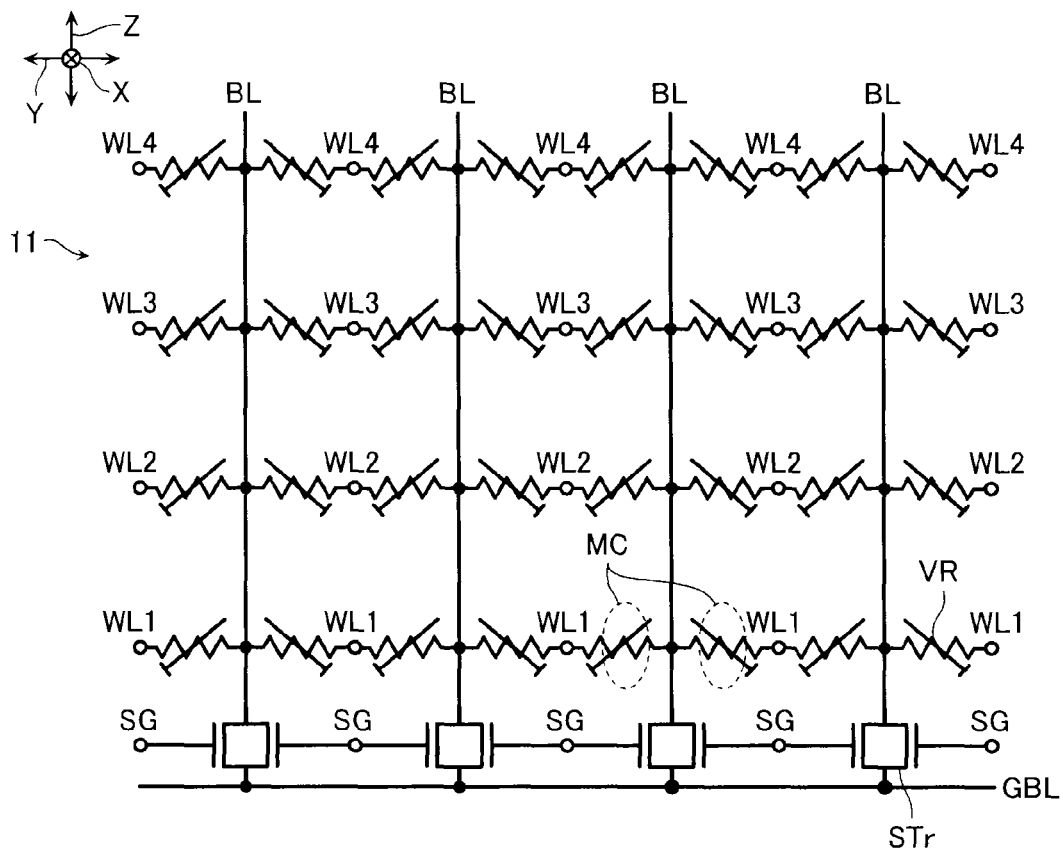
FIG. 2 is a circuit diagram illustrating a constitution of a memory cell array.

FIG. 2 is a circuit diagram illustrating a constitution of the memory cell array 11. In FIG. 2, an X direction, a Y direction, and a Z direction are orthogonal to one another. The X direction is vertical to a paper. The structures illustrated in FIG. 2 are repeatedly disposed in the X direction. The memory cell array 11 also includes, in addition to the above-described word lines WL, bit lines BL, and memory cells MC, selection transistors STr, a global bit line GBL, and selection gate lines SG.

The word lines WL extend in the X direction (first direction). The word lines WL are arranged in the Y direction (second direction) and the Z direction (third direction) at predetermined pitch. Among the word lines WL arranged in the Z direction, in FIG. 2 the word line disposed closest to the selection gate line SG is denoted as the word line WL1. Similarly, in the following the word lines are denoted as WL2, WL3, and WL4. The bit line BL extends in the Z direction. The bit lines BL are disposed in the X direction and the Y direction at predetermined pitch in a matrix. The memory cell MC is disposed at a region where the word line WL intersects with the bit line BL. The memory cell MC includes the variable resistive element. As illustrated in the drawing, the two memory cells MC share the word line WL.

The selection transistor STr is disposed between one end of the bit line BL and the global bit line GBL. The global bit line GBL extends in the Y direction. The global bit lines GBL are arranged in the X direction at predetermined pitch. The one global bit line GBL is coupled in common to one ends of the plurality of selection transistors STr, which are arranged in the Y direction. That is, the one global bit line GBL is coupled in common to one ends of the plurality of bit lines BL, which are arranged in the Y direction.

The selection gate line SG extends in the X direction. The selection gate lines SG are arranged in the Y direction at predetermined pitch. The one selection gate line SG is coupled in common to gates of the plurality of selection transistors STr, which are arranged in the X direction.

Figure 3:
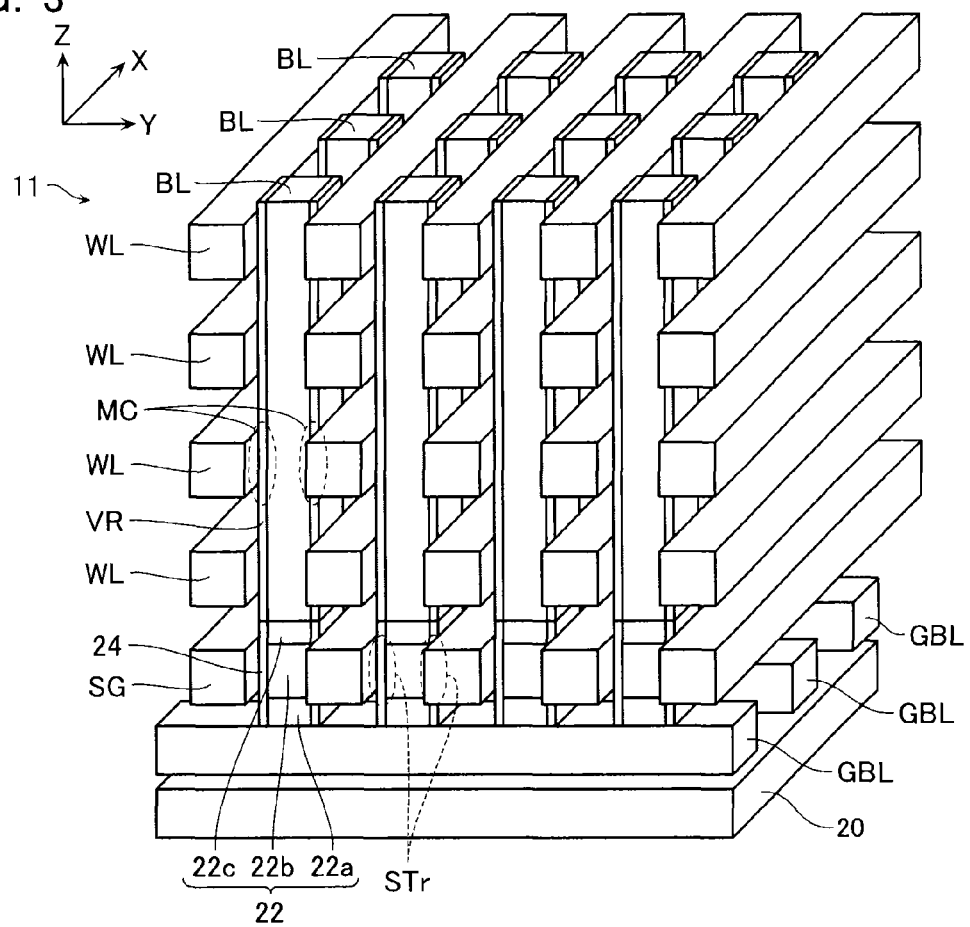
FIG. 3 is an outline perspective view illustrating the constitution of the memory cell array.

FIG. 3 is an outline perspective view illustrating the constitution of the memory cell array 11. On a substrate 20, the plurality of global bit line GBL layers, which extend in the Y direction, are formed. On the plurality of global bit line GBL layers, a plurality of selection gate line SG layers, which extend in the X direction, are formed. Further, on the plurality of selection gate line SG layers, a plurality of word line WL (WL1 to WL4) layers, which extend in the X direction, are laminated. The columnar-shaped bit lines BL extending in the Z direction are disposed between the word lines WL in a matrix. The bit line BL and the selection gate line SG are, for example, made of polysilicon. The word line WL and the global bit line GBL are, for example, made of a low-resistance semiconductor where impurities are doped at high concentration or a metallic material.

A columnar-shaped semiconductor layer 22 is formed at an end of the bit line BL on the substrate 20 side. The semiconductor layer 22, for example, is formed by laminating an N+type semiconductor layer 22a, a P-type semiconductor layer 22b, and an N+ type semiconductor layer 22c in the order from the substrate 20 side. The P-type semiconductor layer 22b may be referred to as a channel layer 22b from its functionality. A gate insulating film 24 is formed between the channel layer 22b and the selection gate line SG. The gate insulating film 24 is, for example, made of silicon oxide ($SiO_2$). The semiconductor layer 22, the gate insulating film 24, and the selection gate line SG function as the selection transistor STr. The selection transistor STr selects the desired bit line BL among the plurality of bit lines BL coupled to the one global bit line GBL.

A variable resistance layer VR is formed at a side surface of the bit line BL, which is opposed to the word line WL. The variable resistance layer VR is a material to transit between at least two resistance values of a low resistance state (LRS) and a high resistance state (HRS). The variable resistance layer VR functions as a part of the memory cell MC, which stores data, at the intersection portion of the word line WL and the bit line BL. For the variable resistance layer VR, for example, hafnium oxide (HfO) is employed. Besides, a thin film layer containing $TiO_2$, $ZnMn_2O_4$, NiO, AlO, $SrZrO_3$, $Pr_{0.7}Ca_{0.3}MnO_3$, or a similar element is employed as necessary.

Figure 4:
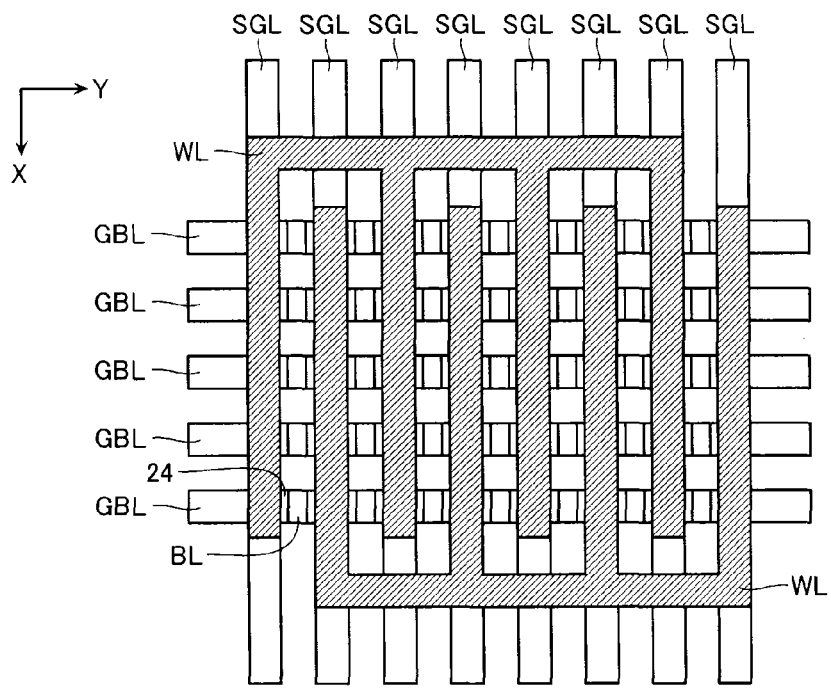
FIG. 4 is a plan schematic diagram illustrating the constitution of the memory cell array.

FIG. 4 is a plan view of the memory cell array 11 in FIG. 3 viewed from upward (opposite side of the substrate 20). As illustrated in FIG. 4, a base portion extends in the Y direction. The base portion bundles the plurality of word lines WL, which extend in the X direction, at every other piece. Thus, the bundled word lines WL form a comb-shaped electrode pattern opposed to one another. The same voltage is provided to the respective comb-shaped electrode patterns.

Data is written to/read from/deleted from the memory cell MC as follows. A predetermined voltage is applied to the selection gate lines SG, which are positioned at both sides of the selection transistor STr. Thus, this selection transistor STr is placed in a conductive state. This applies the predetermined voltage (for example, a ground voltage) for writing/reading/deletion from the global bit line GBL to the bit line BL. At the same time, a predetermined selected voltage (for example, a power supply voltage) is applied to any given selected word line among the word lines WL1 to WL4. A non-selected voltage (for example, a ground potential) is applied to the other word lines. By the above-described operations, among the variable resistance layers VR, a current flows in a region sandwiched between the selected bit line BL and word line WL. Thus, data is written/read/deleted. This region is, as illustrated in FIG. 3, functions as the memory cell MC.

Data is written (the setting operation) by changing the resistance value of the variable resistance layer VR from a first state (for example, the high resistance state) to a second state (for example, the low resistance state). Data is deleted (the resetting operation) by changing the resistance value of the variable resistance layer VR from the second state (the low resistance state) to the first state (the high resistance state). When reading data from the memory cell MC, the resistance value of the variable resistance layer VR does not change. The data may be deleted in units of blocks batching the plurality of memory cells.

Here, in a formation process of the semiconductor layer 22 in FIG. 3, the following situation may occur. As effective sizes and dopant concentrations vary, current-voltage characteristics of the selection transistor STr vary. This may affect operations of the semiconductor memory device. For example, during data writing (during the setting operation), the following is preferred. The selection transistor STr restricts a transient current such that transition to the low resistance state (LRS) does not cause excessively low resistance. However, if the current-voltage characteristics in the selection transistor STr largely varies, the resistance value of the low resistance state (LRS) in the variable resistance layer VR also largely varies. This may make it difficult to ensure an operation margin of the memory cell.

The following embodiment describes a semiconductor memory device that reduces the variation of the current-voltage characteristics in the selection transistor STr to enhance reliability during operation.

Figure 5A:
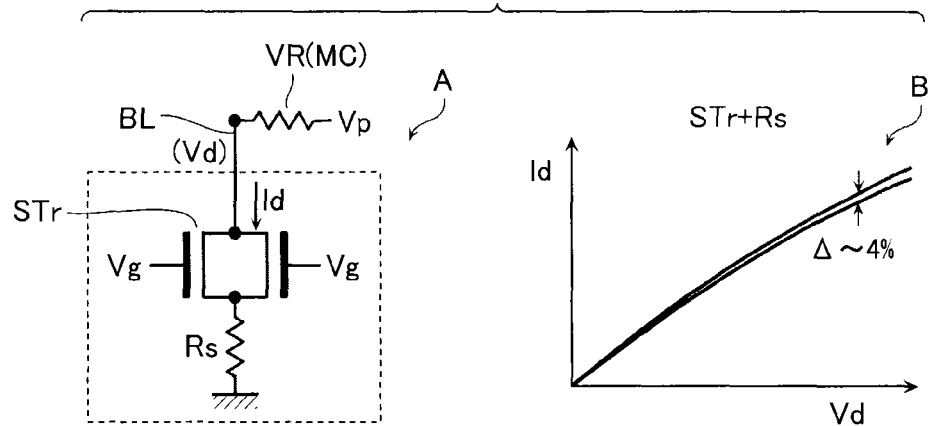
FIG. 5A is a drawing for describing an operating principle of the semiconductor memory device according to the first embodiment.
Figure 5B:
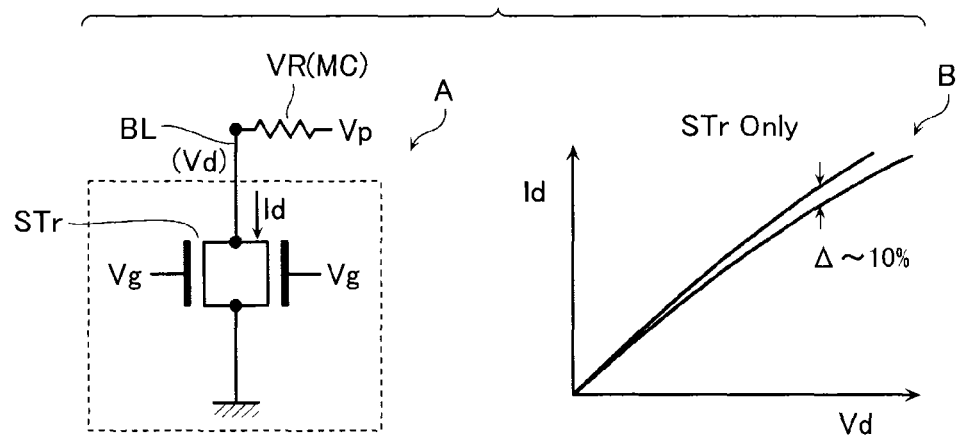
FIG. 5B is a drawing for a comparative configuration corresponding to FIG. 5A.

FIG. 5A is a drawing for describing an operating principle of the semiconductor memory device according to the first embodiment, and FIG. 5B is a drawing for a comparative configuration corresponding to FIG. 5A. Reference numeral A in FIG. 5A denotes an equivalent circuit diagram of an extraction of a part of the memory cell array 11. One end of the selection transistor STr is coupled to the memory cell MC via the bit line BL. The other end of the selection transistor STr is grounded via a resistive element Rs. Accordingly, the selection transistor STr is configured to have a high potential (drain) at the memory cell MC side and have a low potential (source) at the opposite side. The resistive element Rs can be configured to have a resistance value of, for example, 50 kΩ.

A voltage Vp is applied from the word line (not illustrated) to the memory cell MC. This applies a drain voltage Vd to a terminal of the selection transistor STr on the memory cell MC side. A gate voltage Vg is applied to the gate terminal of the selection transistor STr. Consequently, a drain current Id flows in the selection transistor STr.

Reference numeral B in FIG. 5A is a graph illustrating a relation between the drain voltage Vd and the drain current Id in the selection transistor STr indicated in reference numeral A. As the drain voltage Vd increases, the drain current Id also non-linearly increases. However, the above-described variation of the current-voltage characteristics in the selection transistor STr generates a predetermined error (for example, 4% or less) in a degree of increase.

In the comparative configuration of FIG. 5B, as indicated in reference numeral A, the resistive element Rs is not disposed between the selection transistor STr and the ground potential. Consequently, in the graph of reference numeral B, the error (for example, 10% or less) caused by the variation of the current-voltage characteristics is larger than the error in FIG. 5A.

The reason for generating the above-described phenomenon is as follows. That is, when inserting the resistive element Rs between the selection transistor STr and the ground potential, a voltage drop corresponding to Id×Rs, which is a product of the drain current Id and the resistance value of the resistive element Rs, occurs at the resistive element Rs. As a result, the source electric potential of the selection transistor STr increases. An effective drain-source voltage Vds also reduces by Id×Rs (Vds=Vd−Id×Rs). Further, an effective gate-source voltage Vgs also reduces by Id×Rs (Vgs=Vg−Id×Rs).

The above-described reductions of the drain-source voltage Vds and the gate-source voltage Vgs both act for a reduction of the drain current Id flowing between the drain and the source of the selection transistor STr (negative feedback). The larger the original drain current Id, the larger an amount of voltage drop caused by the above-described negative feedback is. Accordingly, the amount of reduction of the effective drain-source voltage Vds also becomes large. Consequently, compared with the case where the resistive element Rs is not inserted, the variation of the current-voltage characteristics in the selection transistor STr can be reduced.

As described above, with the semiconductor memory device according to the embodiment, the resistive element Rs is disposed on the global bit line GBL side with respect to the selection transistor STr allows adjusting a magnitude of the voltage applied to the selection transistor STr according to a magnitude of the current flowing through the selection transistor STr. This allows reducing a failure during operation caused by the variation of the current-voltage characteristics in the selection transistor STr.

The resistive element Rs may be disposed separately from the constitution of the conventionally known memory cell array and peripheral circuit. However, use of the already-existing constitution is preferable from the aspect of cost or a similar factor. The following further describes specific examples of preferred embodiments in detail.

Figure 6:
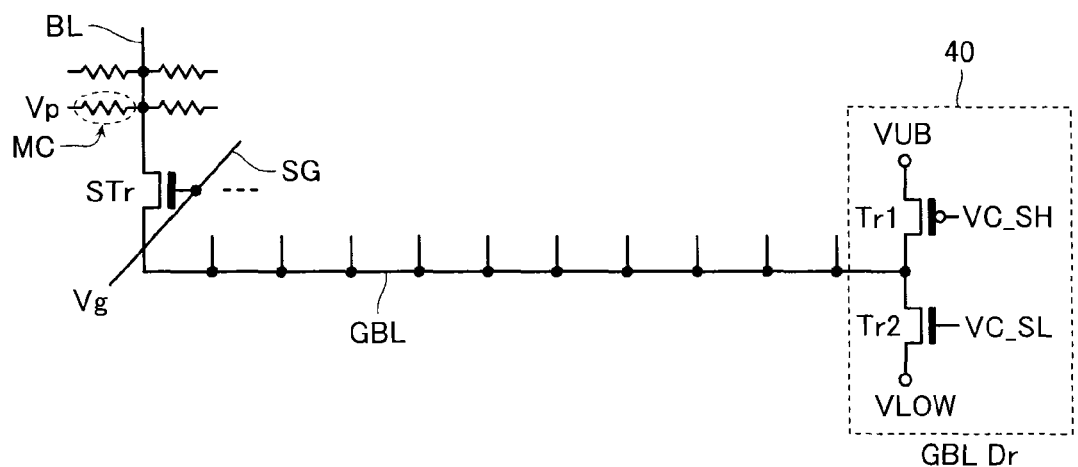
FIG. 6 is a drawing of partial extraction of the memory cell array and a peripheral circuit.

FIG. 6 is a drawing of partial extraction of the memory cell array 11 and a peripheral circuit in the semiconductor memory device according to the first embodiment. The memory cells MC are coupled to both sides of the bit line BL. The one end of the bit line BL is coupled to the global bit line GBL via the selection transistor STr. The selection gate line SG is coupled to the gate terminal of the selection transistor STr. The plurality of bit lines BL are coupled parallel to the global bit line GBL. A global bit line driving circuit (hereinafter referred to as a "GBL driving circuit 40") is coupled to the end of the global bit line GBL.

The GBL driving circuit is a CMOS circuit that includes a P type (first conductive type) first transistor Tr1 and an N type (second conductive type) second transistor Tr2. The first transistor Tr1 is coupled to a power supply VUB (first power supply) on a high potential side. The second transistor Tr2 is coupled to a power supply VLOW (second power supply) on a low potential side. The first transistor Tr1 and the second transistor Tr2 are coupled between the power supply VUB and the power supply VLOW in series. The global bit line GBL is coupled to a node of the coupling portion of the first transistor Tr1 and the second transistor Tr2. A first gate voltage VC_SH is supplied to the gate terminal of the first transistor Tr1. A second gate voltage VC_SL is supplied to the gate terminal of the second transistor.

Here, with the conventional known driving circuit of the global bit line, the same voltage is supplied to the gates of the first transistor Tr1 and the second transistor Tr2. This sets one transistor to a complete on-state and the other transistor to a complete off-state. One of the power supply VUB or the power supply VLOW is supplied to the global bit line GBL.

In contrast to this, with the GBL driving circuit 40 illustrated in FIG. 6, different voltages (the first gate voltage VC_SH, the second gate voltage VC_SL) can be supplied to the respective gate terminal of the first transistor Tr1 and gate terminal of the second transistor Tr2. For example, while selecting the global bit line GBL, the first gate voltage VC_SH becomes a sufficiently high voltage to completely turn off the P type first transistor Tr1.

In contrast to this, the second gate voltage VC_SL becomes a voltage lower than a voltage to completely turn on the N type second transistor Tr2 and higher than a voltage to completely turn off the N type second transistor Tr2. That is, the second transistor Tr2 functions as a variable resistor that changes the resistance value according to the magnitude of the second gate voltage VC_SL. Adjusting this second gate voltage VC_SL appropriately allows setting the resistance value of the resistive element Rs (see reference numeral A in FIG. 5A) to a desired value (for example, 50 kΩ). This allows further effectively reducing the variation of the current-voltage characteristics in the selection transistor STr.

Here, the smaller the value of the second gate voltage VC_SL, the larger the resistance value of the second transistor Tr2 as the resistive element becomes. This allows reducing the variation of the current-voltage characteristics in the selection transistor STr. However, excessively large value of the resistive element Rs requires application of large voltage to flow a sufficient current through the memory cell MC. This is not preferable from the aspect of power consumption or a similar factor. Thus, to configure the resistive element Rs as the variable resistor, it is preferred that an appropriate resistance value be calculated considering both of the current flowing through the memory cell MC and the effect of reducing the variation of the current-voltage characteristics in the selection transistor STr.

Figure 7:
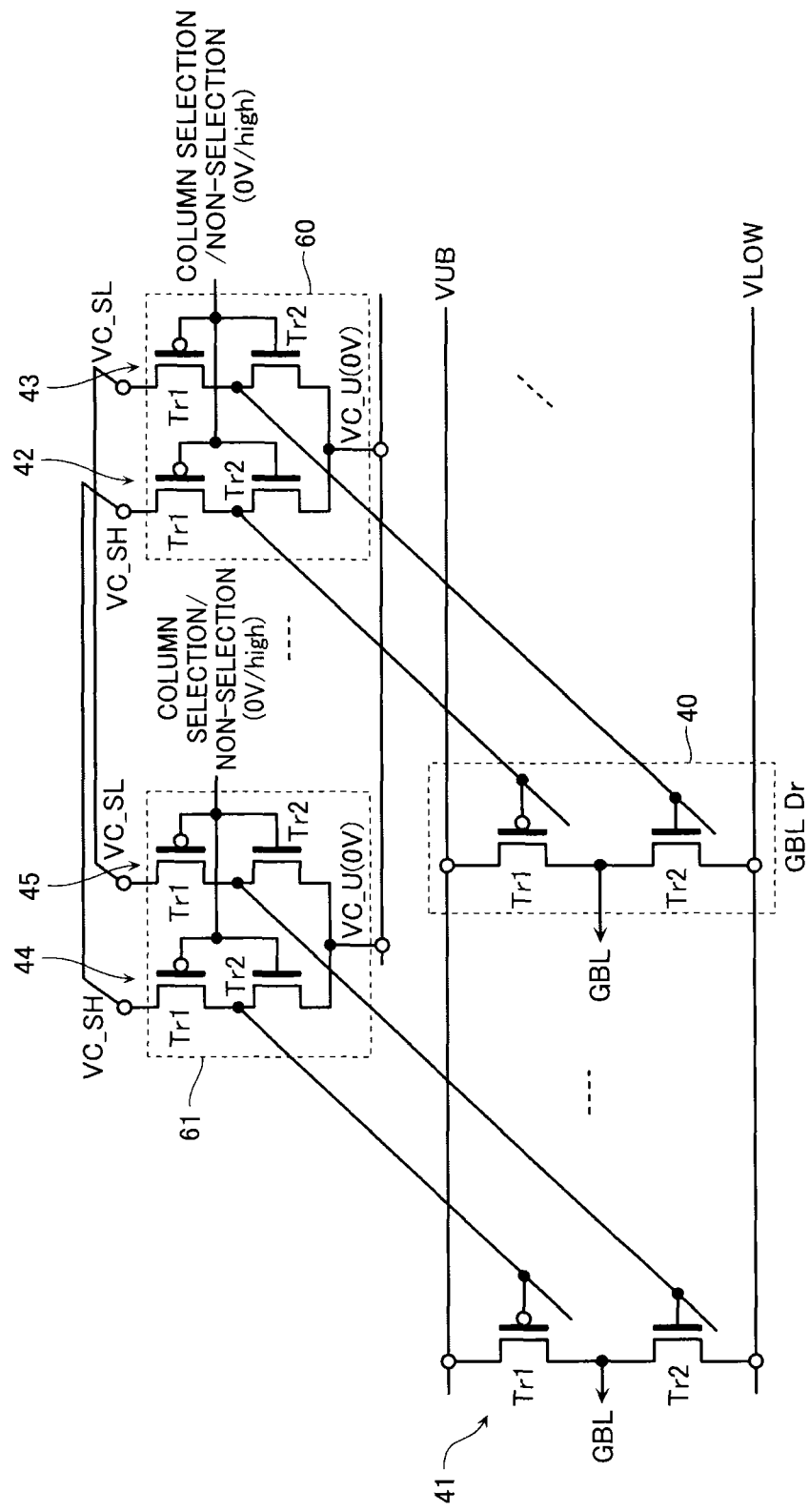
FIG. 7 is a circuit diagram (first) of extraction of a GBL driving circuit and a peripheral circuit of the GBL driving circuit.

The following describes a constitution to supply different voltages (VC_SH, VC_SL) to the gate terminals of the transistors (Tr1, Tr2) in the GBL driving circuit. FIG. 7 is a circuit diagram of partial extraction of a peripheral circuit of the semiconductor memory device according to the first embodiment. An output terminal of a CMOS circuit 42 is coupled to the gate terminal of the first transistor Tr1 in the GBL driving circuit 40. An output terminal of a CMOS circuit 43 is coupled to the gate terminal of the second transistor Tr2 in the GBL driving circuit 40. The CMOS circuits 42 and 43 function as a column selecting circuit 60 to select the GBL driving circuit 40.

The COMS circuits 42 and 43, each similarly to the GBL driving circuit 40, include the first transistor Tr1 and the second transistor Tr2 coupled in series. Input terminals (gate terminals) of the COMS circuit 42 and the CMOS circuit 43 are both coupled to supply terminals of a column selection/non-selection voltage (0V/high).

The drain terminal of the first transistor Tr1 in the CMOS circuit 42 is coupled to a power supply of the first gate voltage VC_SH. The drain terminal of the first transistor Tr1 in the CMOS circuit 43 is coupled to a power supply of the second gate voltage VC_SL. Source terminals of the second transistors Tr2 in the CMOS circuit 42 and the CMOS circuit 43 are both coupled to the ground potential VC_U (0V).

Another GBL driving circuit 41 is coupled in common to the power supply lines (VUB, VLOW) to which the GBL driving circuit 40 is coupled. The gate terminals of the first transistor Tr1 and the second transistor Tr2 in this other GBL driving circuit 41 are respectively coupled to output terminals of a CMOS circuit 44 and a CMOS circuit 45. The CMOS circuits 44 and 45 function as a column selecting circuit 61 to select the GBL driving circuit 41.

The constitutions of the CMOS circuits 44 and 45 are similar to the above-described COMS circuits 42 and 43. A power supply terminal of the CMOS circuit 44 on the high potential side is used in common with a power supply terminal of the CMOS circuit 42 on the high potential side. The power supply terminal is coupled to the power supply of the first gate voltage VC_SH. A power supply terminal of the CMOS circuit 45 on the high potential side is used in common with a power supply terminal of the CMOS circuit 43 on the high potential side. The power supply terminal is coupled to the power supply of the second gate voltage VC_SL.

For example, assume the case where a column selection state (0V) is set in the column selecting circuit 60 (the CMOS circuits 42 and 43), the P type first transistor Tr1 enters the on-state while the N type second transistor Tr2 enters the off-state. As a result, from the output terminal of the CMOS circuit 42, the first gate voltage VC_SH is output. From the output terminal of the CMOS circuit 43, the second gate voltage VC_SL is output. The respective voltages are supplied to the GBL driving circuit 40. As described above, the column selection/non-selection voltage, which is supplied to the input terminals of the column selecting circuits 60 and 61 (the CMOS circuits 42 to 45) is appropriately changed. This allows switching a voltage supplied to the gate terminals of the GBL driving circuits 40 and 41.

Figure 8:
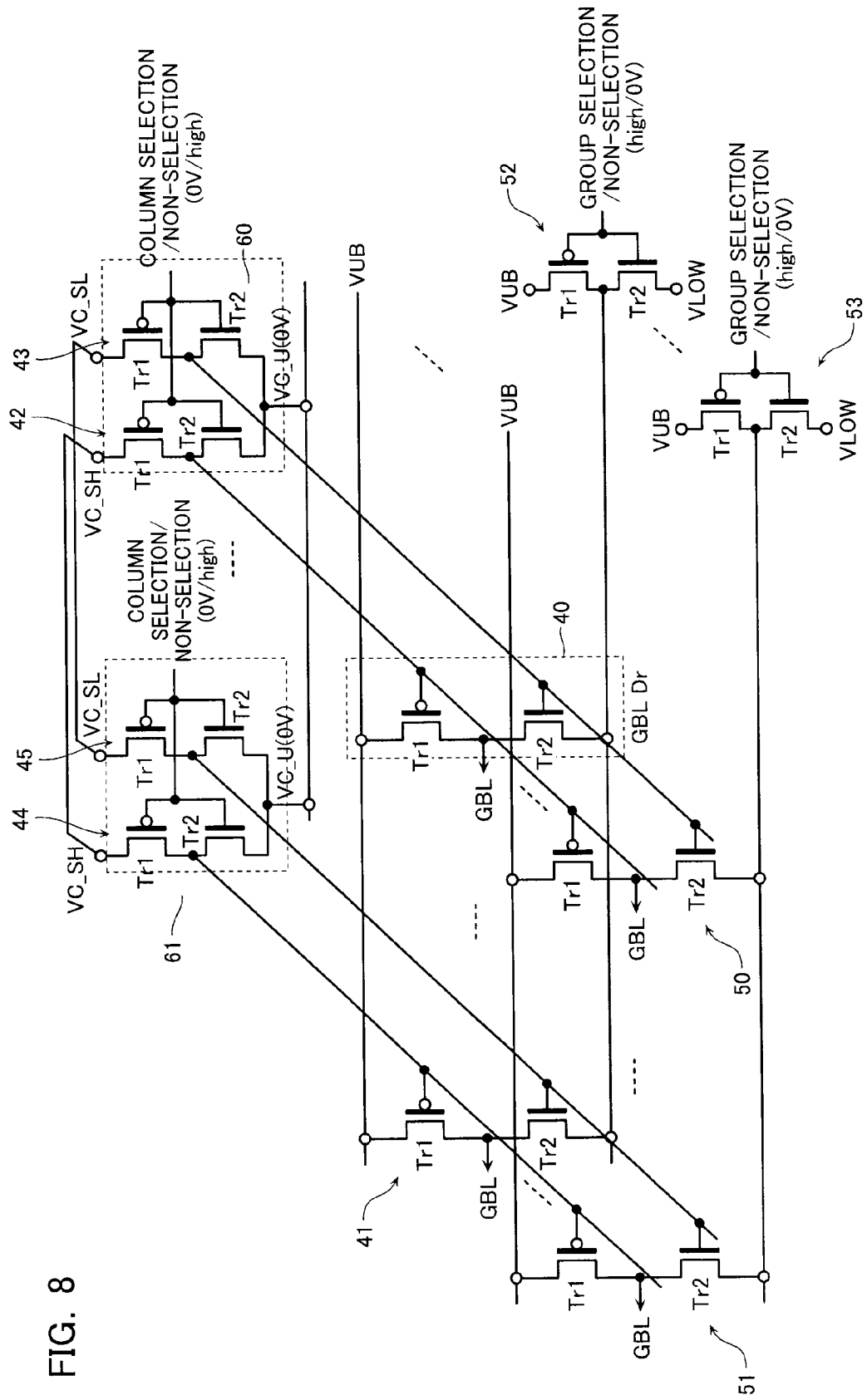
FIG. 8 is a circuit diagram (second) of extraction of a GBL driving circuit and a peripheral circuit of the GBL driving circuit.

FIG. 8 is an example of the case where a two-dimensional decoding is performed as a modification of FIG. 7. The constitutions of the GBL driving circuits 40 and 41 and the constitutions of the column selecting circuits 60 and 61 (the CMOS circuits 42 to 45) coupled to these GBL driving circuits 40 and 41 are the same as the constitutions of FIG. 7. FIG. 8 differs from FIG. 7 in that a group selection circuit 52 is coupled to the second transistors Tr2 of the GBL driving circuits 40 and 41, but the power supply VLOW on the low potential side is not directly coupled. FIG. 8 illustrates a GBL driving circuit 50 having a common gate terminal with the GBL driving circuit 40 and a GBL driving circuit 51 having a common gate terminal with the GBL driving circuit 41. Both the GBL driving circuit 50 and the GBL driving circuit 51 are coupled to the group selection circuit 53.

The group selection circuits 52 and 53 are, similarly to the CMOS circuits 43 to 45, have a constitution where the first transistor Tr1 and the second transistor Tr2 are coupled in series. A drain terminal of the first transistor Tr1 is coupled to the power supply VUB on the high potential side, while a source terminal of the second transistor Tr2 is coupled to a power supply VLOW on the low potential side. The gate terminals of the first transistor Tr1 and the second transistor Tr2 are coupled to a common group selection/non-selection voltage (high/0V). The respective group selection circuits 52 and 53 output the voltage VLOW when a group selection voltage (high) is supplied and output the voltage VUB when a group non-selection voltage (0V) is supplied.

Here, for example, when selecting the GBL driving circuit 40, a column selection voltage (0V) is supplied to the column selecting circuit 60 and a column non-selection voltage (high) is supplied to the column selecting circuit 61. As a result, the first gate voltage VC_SH and the second gate voltage VC_SL are supplied to the GBL driving circuits 40 and 50, which are coupled in common to the column selecting circuit 60.

Further, when selecting the GBL driving circuit 40, the group selection voltage (high) is supplied to the group selection circuit 52 and the group non-selection voltage (0V) is supplied to the group selection circuit 53. Accordingly, the voltage VLOW is supplied to the GBL driving circuit 40 while the voltage VUB is supplied to the GBL driving circuit 50. Accordingly, from the GBL driving circuit 40, the voltage VLOW (actually, a voltage higher than VLOW by an amount of the voltage drop in the second transistor Tr2) is output. From the GBL driving circuit 50, the voltage VUB is output. As described above, among the four GBL driving circuits (40, 41, 50, and 51), only the GBL driving circuit 40 is selected consequently.

In the case of a decoding system (one-dimensional decoding) illustrated in FIG. 7, the N sets of GBL driving circuits and the N sets of column selecting circuits are required for the N sets of global bit lines. In contrast to this, in the case of the decoding system (two-dimensional decoding) illustrated in FIG. 8, when configuring N1 sets of the column selecting circuits and N2 sets of the group selection circuits, N=N1×N2 needs to be met. Here, as long as both N1 and N are three or more, N=N1×N2>N1+N2 is met. The two-dimensional decoding system, which is illustrated in FIG. 8, is advantageous in that the number of CMOS circuits can be reduced and a circuit area can be reduced compared with FIG. 7.

Figure 9A:
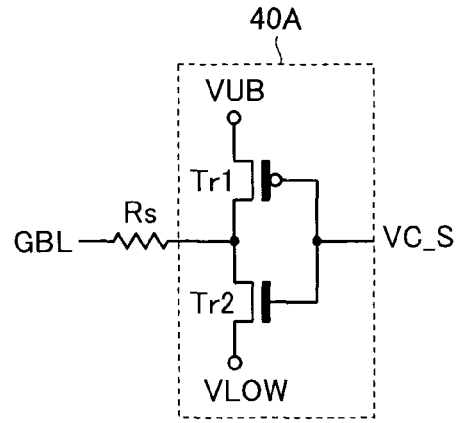
FIG. 9A to FIG. 9C are circuit diagrams illustrating modifications of the GBL driving circuit described in FIG. 6.
Figure 9B:
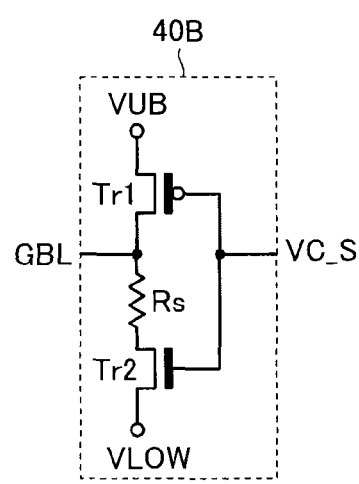
Figure 9C:
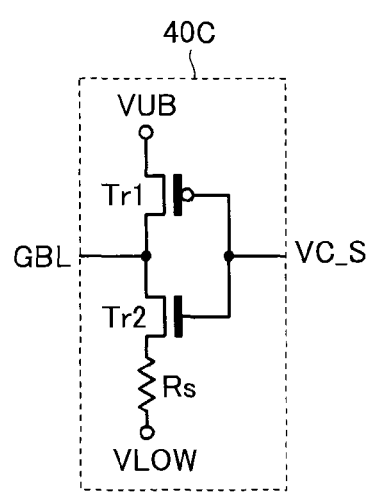

FIG. 9A to FIG. 9C are diagrams illustrating modifications of the GBL driving circuit described in FIG. 6. Different from FIG. 6, to the first transistor Tr1 and the second transistor Tr2, a common voltage VC_S is supplied. During the operation, the one transistor completely enters the on-state while the other transistor completely enters the off-state. Instead, in a part of the CMOS circuit, the resistive element Rs made of, for example, polysilicon is inserted.

In FIG. 9A, the resistive element Rs is inserted between a coupling portion of the first transistor Tr1 and the second transistor Tr2 and the global bit line GBL. In FIG. 9B, the resistive element Rs is inserted between a coupling portion of the first transistor Tr1 and the second transistor Tr2 and the second transistor Tr2. In FIG. 9C, the resistive element Rs is inserted between the second transistor Tr2 and the power supply VLOW.

In the constitutions of FIG. 9A to FIG. 9C, the resistive element Rs is inserted between the global bit line GBL and the power supply VLOW. Accordingly, even if the second transistor Tr2 is not employed as the resistive element, the variation of the current-voltage characteristics in the selection transistor STr can be reduced. As illustrated in FIG. 6, the second transistor Tr2 may be employed as the resistive element while the resistive element Rs illustrated in FIG. 9A to FIG. 9C may be further inserted.

Second Embodiment

The second embodiment is an example where the resistance value of the resistive element is changed according to a wiring resistance of the global bit line.

Figure 10:
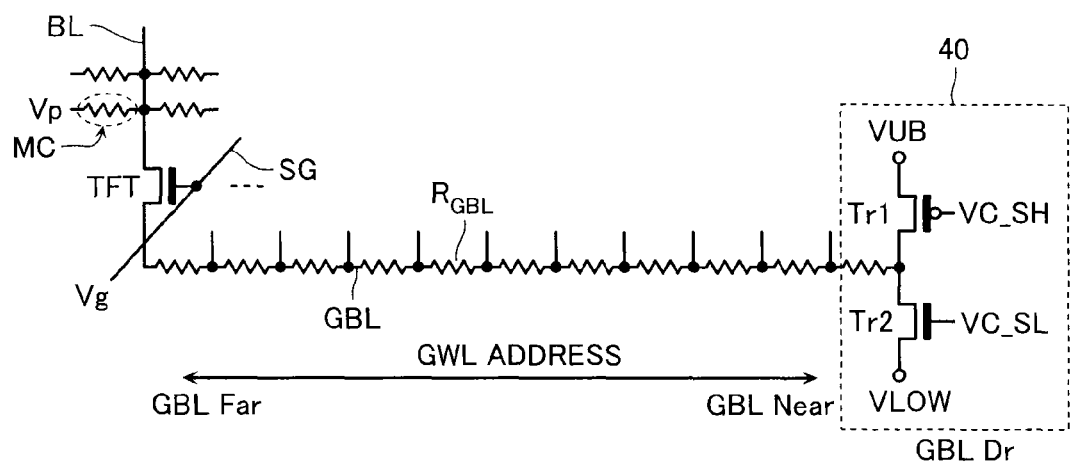
FIG. 10 is a drawing of partial extraction of a memory cell array and a peripheral circuit of a semiconductor memory device according to a second embodiment.

FIG. 10 is a drawing of partial extraction of the memory cell array 11 and the peripheral circuit of a semiconductor memory device according to a second embodiment. A description of a part same as the first embodiment (FIG. 6) is omitted.

As illustrated in FIG. 10, the actual global bit line GBL includes a wiring resistance $R_{GBL}$. This wiring resistance is, similarly to the resistive element Rs illustrated in FIG. 5A, has a function to minimize the variation of voltage-current characteristics in the selection transistor STr due to a voltage drop. Accordingly, to determine the resistance value of the resistive element Rs newly added, considering the wiring resistance $R_{GBL}$ in the global bit line GBL is preferred.

The magnitude of the wiring resistance $R_{GBL}$ is proportionate to a length of the wiring, that is, a length of the global bit line GBL from the selection transistor STr corresponding to the selected memory cell MC to the GBL driving circuit 40. That is, the closer the region to the GBL driving circuit 40 (GBL Near), the smaller the wiring resistance becomes. The farther the region from the GBL driving circuit 40 (GBL Far), the larger the wiring resistance becomes.

Figure 11:
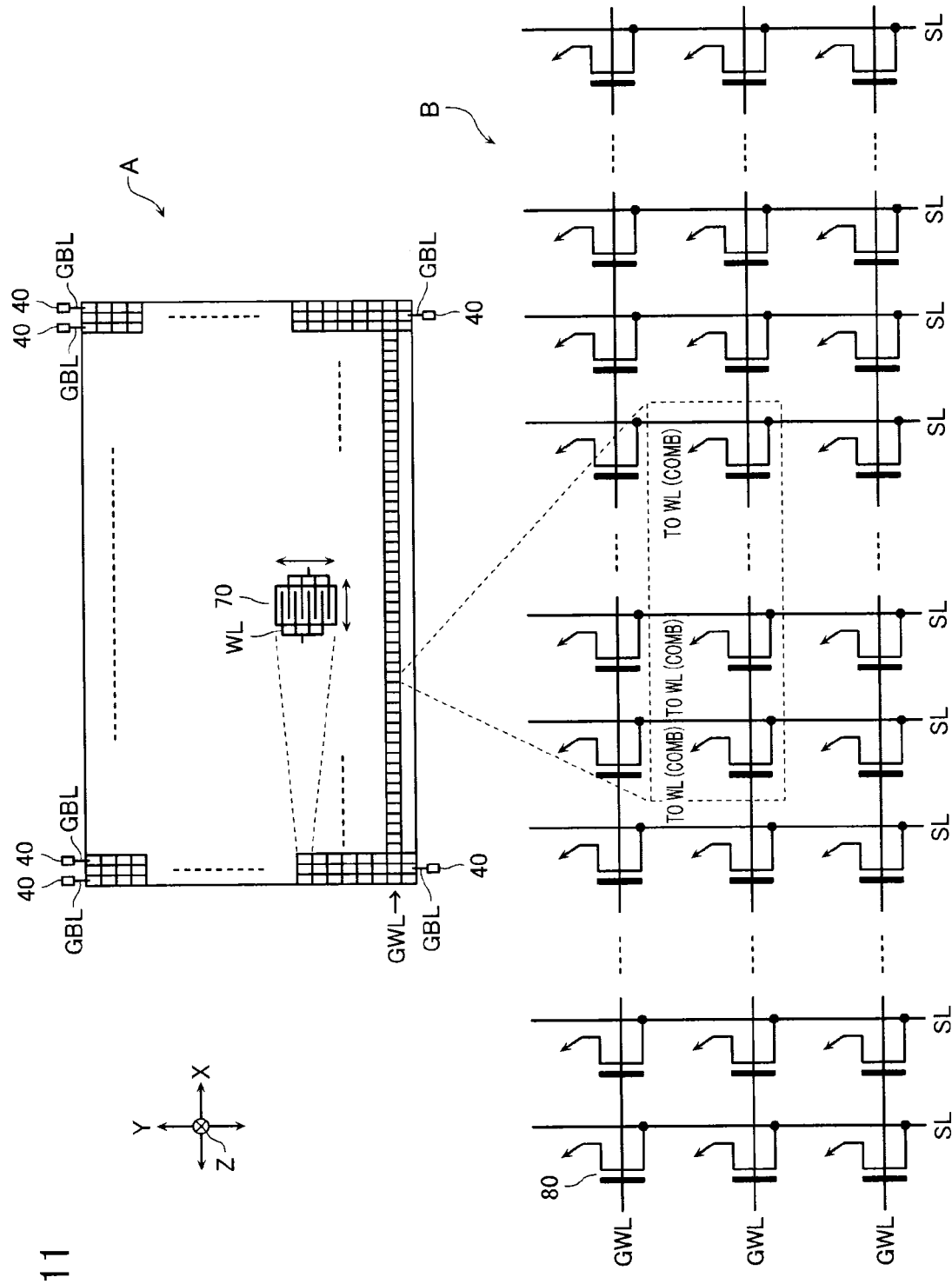
FIG. 11 is a schematic diagram of a top surface of the memory cell array.

Here, an address of a global word line GWL (GWL address) illustrated in FIG. 11 is an indication for measuring the length of the above-described global bit line GBL. The following describes this respect.

FIG. 11 is a schematic diagram of a top surface of the memory cell array 11 viewed from the Z direction. Reference numeral A denotes an overall view, and reference numeral B denotes an enlarged view of a part of the region. As indicated by reference numeral A, the global bit line GBL extends in the Y direction. A global word line GWL extends in the X direction intersecting with the global bit line GBL. The GBL driving circuits 40 are alternately disposed at respective end parts of the global bit lines GBL. At an intersection region of the global bit line GBL and the global word line GWL, a set of the wiring patterns of the opposed comb-shaped word lines WL (hereinafter referred to as a "WL comb 70"), which is described in FIG. 4, is disposed.

As indicated by reference numeral B, seeing more detail, a plurality of source lines SL (power supply lines) are disposed. The plurality of source lines SL extend in the Y direction with respect to the global word lines GWL, which extend in the X direction. A word line selection transistor 80 is disposed at an intersection region of the global word line GWL and the source line SL. A gate terminal of the word line selection transistor 80 is coupled to the global word line GWL. One of a source/drain terminal is coupled to the source line SL while the other source/drain terminal is coupled to the WL comb 70.

Here, when performing the reading, writing, or deletion operation on data, the global word line GWL corresponding to the WL comb 70 coupled to the selected memory cell is selected. The global word line GWL and the global bit line GBL are mutually orthogonal as indicated in reference numeral A. When determining the address of the global word line GWL, a distance from the selection transistor STr corresponding to the selected memory cell to the GBL driving circuit 40 is also almost determined. Accordingly, with the circuit configuration illustrated in FIG. 11, based on the address of the global word line GWL, the wiring resistance of the global bit line GBL can be calculated.

Figure 12:
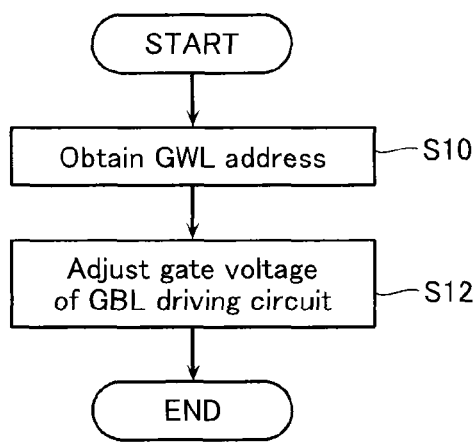
FIG. 12 is a flowchart illustrating operations of the semiconductor memory device according to the second embodiment.

FIG. 12 is a flowchart illustrating operations of the semiconductor memory device according to the second embodiment. First, the control circuit 14 obtains the address of the global word line GWL (GWL address) corresponding to the selected memory cell (Step S10). Next, the control circuit 14 adjusts a gate voltage of the GBL driving circuit 40 based on the obtained GWL address (Step S12). More specifically, in the GBL driving circuit 40, the second gate voltage VC_SL of the second transistor Tr2 is adjusted. Thus, a resistance value of the second transistor Tr2 is set to an appropriate value.

For example, in FIG. 10, it is assumed that the total resistance value of the wiring resistance $R_{GBL}$ of the global bit line GBL and the second transistor Tr2 as the resistive element Rs is preferable to be set to 50 kΩ. In this case, for example, when the wiring resistance $R_{GBL}$ is 40 kΩ, the resistance value of the resistive element Rs is set to 10 kΩ, and when the wiring resistance $R_{GBL}$ is 10 kΩ, the resistance value of the resistive element Rs is set to 40 kΩ. In this way, the resistance value of the resistive element Rs is adjusted. Thus, considering the wiring resistance $R_{GBL}$ of the global bit line GBL into account, the resistance value of the resistive element Rs is determined. This allows equalizing the value of a voltage drop due to the resistance regardless of selection of the selection transistor STr. As a result, the variation of the current-voltage characteristics in the selection transistor STr can be further effectively reduced.

The second embodiment describes an example of adjusting the resistance value of the resistive element Rs based on the above-described GWL address. However, the following constitution is also possible. Another method may be employed to calculate the length of the global bit line GBL (distance from the GBL driving circuit 40 to the selection transistor STr) or the wiring resistance and appropriately adjust the resistance value of the resistive element Rs based on these calculated values.

Third Embodiment

The third embodiment is an example of inserting a resistive element not into the global bit line but into the word line side.

Figure 13:
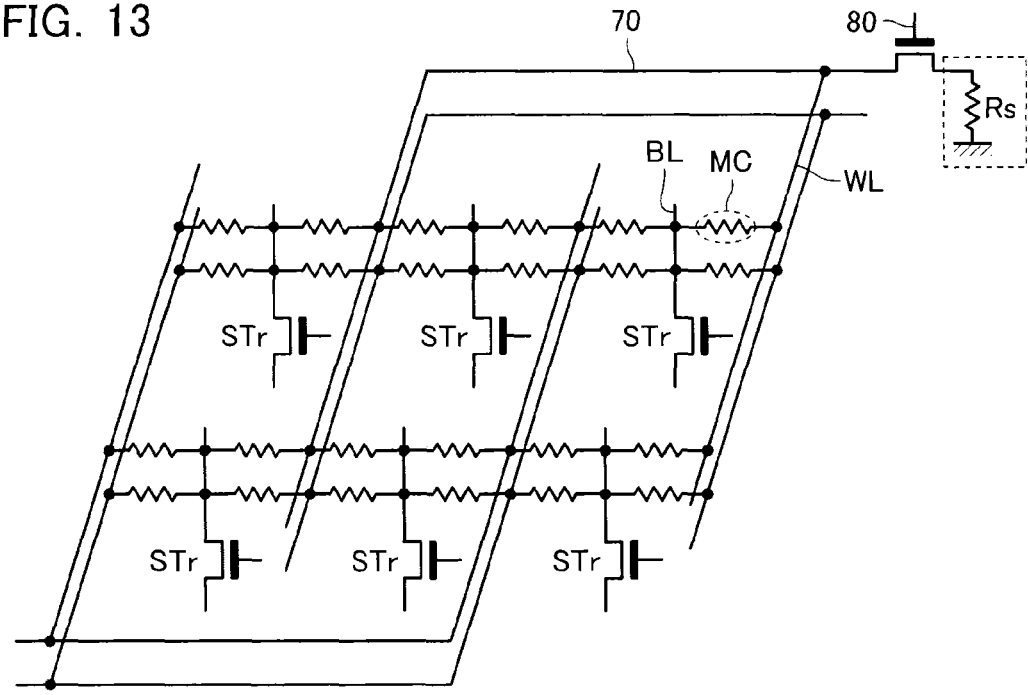
FIG. 13 is a drawing of partial extraction of a memory cell array and a peripheral circuit of a semiconductor memory device according to a third embodiment.

FIG. 13 is a drawing of partial extraction of a circuit configuration of a semiconductor memory device according to the third embodiment. FIG. 13 illustrates a part of the WL comb 70 illustrated in FIG. 11. The one end of the memory cell MC is coupled to the word line WL (the WL comb 70) while the other end is coupled to the bit line BL. The one end of the word line selection transistor 80 is coupled to the WL comb 70 while the other end is grounded via the resistive element Rs.

Here, this embodiment uses the memory cell MC of bipolar system (variable resistive element inverting a current flowing direction between the setting operation and the resetting operation). In view of this, for example, it is assumed that in the resetting operation, different from the case of the first embodiment (FIG. 6), the bit line BL side becomes a high potential while the word line WL side becomes a low potential. In this case, similarly to the variation of the current-voltage characteristics in the selection transistor STr described in FIG. 5A and FIG. 5B, the current-voltage characteristics varies in the word line selection transistor 80. However, as illustrated in FIG. 13, inserting the resistive element Rs on the ground potential side allows reducing the variation of the current-voltage characteristics similarly to the case of FIG. 5A.

Figure 14:
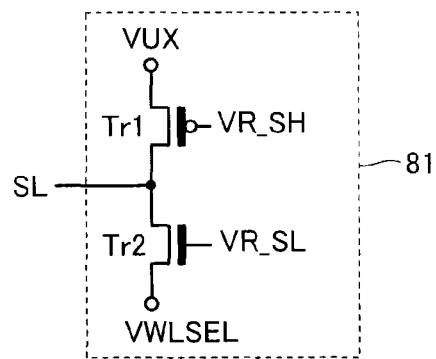
FIG. 14 is a circuit diagram illustrating a constitution of a word line driving circuit.

FIG. 14 is a diagram illustrating a constitution of a word line driving circuit 81. In the word line driving circuit 81, similarly to the GBL driving circuit 40, between the power supply (VUX) on the high potential side and the power supply (VWLSEL) on the low potential side, the first transistor Tr1 and the second transistor Tr2 are coupled in series. Anode coupled to both is configured to be an output terminal. A first gate voltage VR_SH is supplied to a gate terminal of the first transistor Tr1. A second gate voltage VR_SL is supplied to a gate terminal of the second transistor Tr2. Then, an output of the word line driving circuit 81 is coupled to the source line SL of FIG. 10. In this embodiment, the word line WL is selected by a group selection using the source line SL and the two-dimensional decoding using the global word line GWL.

When the WL comb 70 is in a non-group selected state, a low level voltage is supplied to both as the first gate voltage VR_SH and the second gate voltage VR_SL. The first transistor Tr1 turns on while the second transistor Tr2 turns off. Consequently, even if the global word line GWL corresponding to the WL comb 70 is selected, a word line non-selection voltage VUX is supplied to the WL comb 70. On the other hand, if the WL comb 70 is group-selected, a high level voltage is supplied to the first gate voltage VR_SH and an intermediate level voltage is supplied to the second gate voltage VR_SL. Accordingly, when selecting the global word line GWL corresponding to the WL comb 70, a word line selection voltage VWLSEL is supplied to the WL comb 70. However, the second transistor Tr2 functioning as a variable resistor according to the value of the second gate voltage VR_SL causes a voltage drop to occur at the second transistor Tr2. Consequently, similarly to the GBL driving circuit 40 in the first embodiment, the word line driving circuit 81 can be used as the resistive element Rs.

The resistive element of the third embodiment may be disposed separately from the word line driving circuit 81 as illustrated in FIG. 13 (in FIG. 13, the word line driving circuit 81 is coupled to a part illustrated as the ground potential). As illustrated in FIG. 14, the word line driving circuit 81 may partially work as the resistive element Rs. As illustrated in FIG. 9A to FIG. 9C, the resistive element Rs may be further disposed in a part of the word line driving circuit 81.

The first and the second embodiments insert the resistive element Rs on the global bit line GBL side viewed from the selection transistor STr. The third embodiment inserts the resistive element Rs on the word line side viewed from the word line selection transistor 80. One of these constitutions may be employed alone or both can be employed.

Another Embodiment

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of word lines that extend in a first direction, the plurality of word lines being disposed in a second direction and a third direction by respective predetermined distances, the second direction intersecting the first direction, the third direction intersecting the first direction and the second direction;
a plurality of bit lines that extend in the third direction, the plurality of bit lines being disposed in the first direction and the second direction by respective predetermined distances;
a variable resistance layer disposed between the word line and the bit line, the variable resistance layer functioning as a storage element;

a global bit line coupled in common to the plurality of bit lines;

a selection element disposed between the bit line and the global bit line;

a control circuit able to perform respective operations of reading, writing, and deletion on the storage element; and a resistive element disposed on the global bit line side with respect to the selection element, the resistive element having a function to adjust a magnitude of a voltage to be applied to the selection element according to a magnitude of a current flowing through the selection element.

2. The semiconductor memory device according to claim 1, wherein the resistive element is a variable resistor.

3. A semiconductor memory device, comprising:

a plurality of word lines that extend in a first direction, the plurality of word lines being disposed in a second direction and a third direction by respective predetermined distances, the second direction intersecting the first direction, the third direction intersecting the first direction and the second direction;

a plurality of bit lines that extend in the third direction, the plurality of bit lines being disposed in the first direction and the second direction by respective predetermined distances;

a variable resistance layer disposed between the word line and the bit line, the variable resistance layer functioning as a storage element;

a global bit line coupled in common to the plurality of bit lines;

a selection element disposed between the bit line and the global bit line;

a control circuit able to perform respective operations of reading, writing, and deletion on the storage element; and a resistive element disposed on the word line side with respect to the selection element, the resistive element having a function to adjust a magnitude of a voltage to be applied to the selection element according to a magnitude of a current flowing through the selection element.

4. The semiconductor memory device according to claim 3, wherein the resistive element is a variable resistor.

5. The semiconductor memory device according to claim 4, wherein the plurality of word lines are bundled to a comb-shaped wiring pattern, the wiring pattern being opposed to the first direction, and the resistive element is a word line driving circuit coupled to the comb-shaped wiring pattern.

6. The semiconductor memory device according to claim 5, wherein the word line driving circuit includes a first conductive type first transistor and a second conductive type second transistor, the first transistor being coupled to a first power supply, the second transistor being coupled to a second power supply, the comb-shaped wiring pattern in the word line is coupled to a node to which an output terminal of the first transistor and an output terminal of the second transistor are coupled, and the control circuit is able to apply different voltages to respective control terminal of the first transistor and control terminal of the second transistor.

7. A control method of a semiconductor memory device, wherein the semiconductor memory device includes:

a plurality of word lines that extend in a first direction, the plurality of word lines being disposed in a second direction and a third direction by respective predetermined distances, the second direction intersecting the first direction, the third direction intersecting the first direction and the second direction;

a plurality of bit lines that extend in the third direction, the plurality of bit lines being disposed in the first direction and the second direction by respective predetermined distances;

a variable resistance layer disposed between the word line and the bit line, the variable resistance layer functioning as a storage element;

a global bit line coupled in common to the plurality of bit lines;

a selection element disposed between the bit line and the global bit line;

a control circuit able to perform respective operations of reading, writing, and deletion on the storage element; and a resistive element disposed on the global bit line side with respect to the selection element, the resistive element having a function to adjust a magnitude of a voltage to be applied to the selection element according to a magnitude of a current flowing through the selection element, wherein the control method comprises adjusting a resistance value of the variable resistive element according to a length of the global bit line between the selection element corresponding to the selected storage element and the global bit line driving circuit.

* * * * *